(12) United States Patent
Hoshyar et al.

(10) Patent No.: US 10,153,777 B2
(45) Date of Patent: Dec. 11, 2018

(54) FRACTIONAL FREQUENCY CLOCK DIVIDER WITH DIRECT DIVISION

(71) Applicant: Texas Instruments Incorporated, Dallas, TX (US)

(72) Inventors: Reza Hoshyar, San Jose, CA (US); Wenting Zhou, Milpitas, CA (US); Ali Kiaei, San Jose, CA (US); Baher Haroun, Allen, TX (US); Ahmad Bahai, Lafayette, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 259 days.

(21) Appl. No.: 15/281,617

(22) Filed: Sep. 30, 2016

(65) Prior Publication Data

US 2018/0097523 A1    Apr. 5, 2018

(51) Int. Cl.
*H03L 7/00* (2006.01)
*H03L 7/197* (2006.01)
*H03L 7/16* (2006.01)
*H03L 7/18* (2006.01)

(52) U.S. Cl.
CPC .............. *H03L 7/1976* (2013.01); *H03L 7/16* (2013.01); *H03L 7/18* (2013.01); *H03L 7/1806* (2013.01); *H03L 7/197* (2013.01)

(58) Field of Classification Search
None
See application file for complete search history.

(56) References Cited

U.S. PATENT DOCUMENTS

| 6,353,649 B1 * | 3/2002 | Bockleman | ............. G06F 1/025 |
| | | | 327/107 |
| RE40,424 E * | 7/2008 | Han | ................... H03M 7/3022 |
| | | | 377/47 |
| 7,417,510 B2 | 8/2008 | Huang | |
| 7,463,710 B2 * | 12/2008 | Walsh | ................... H03L 7/1976 |
| | | | 327/156 |

(Continued)

OTHER PUBLICATIONS

International Search Report for PCT Application No. PCT/US2017/060658 dated Mar. 6, 2018.

(Continued)

*Primary Examiner* — Tuan T Lam
(74) *Attorney, Agent, or Firm* — Michael A. Davis, Jr.; Charles A. Brill; Frank D. Cimino (57) ABSTRACT

Disclosed examples include fractional frequency divider circuits, including a counter to provide phase shifted pulse output signals in response to counting of an adjustable integer number $N_K$ cycles of an input clock signal, an output circuit to provide an output clock signal having a first edge between first edges of the pulse output signals, as well as a delta-sigma modulator (DSM), clocked by the second pulse output signal to receive a first predetermined value and to provide a DSM output value, and a phase accumulator to receive a step input value representing a sum of the DSM output value and a second predetermined value. The phase accumulator provides a divisor input signal to the counter, and provides a phase adjustment value to the output circuit to control the position of the first edge of the output clock signal between the first edges of the pulse output signals.

27 Claims, 3 Drawing Sheets

(56) References Cited

U.S. PATENT DOCUMENTS

| | | | | |
|---|---|---|---|---|
| 8,559,587 B1* | 10/2013 | Buell | ................... | H03K 23/68 |
| | | | | 377/47 |
| 8,692,599 B2* | 4/2014 | Gong | ................... | H03L 7/081 |
| | | | | 327/156 |
| 8,810,290 B1* | 8/2014 | Cloutier | ................ | H03L 7/0994 |
| | | | | 327/147 |
| 9,236,873 B1* | 1/2016 | Buell | ................... | H03L 7/0992 |
| 9,484,939 B2* | 11/2016 | Luo | ................... | G06F 1/04 |
| 2003/0048863 A1* | 3/2003 | Saeki | ................... | G06F 7/68 |
| | | | | 375/376 |
| 2008/0191750 A1* | 8/2008 | Wang | ................... | H03L 7/0812 |
| | | | | 327/106 |
| 2009/0103675 A1 | 4/2009 | Yousefi Modghaddam et al. | | |
| 2009/0108898 A1 | 4/2009 | Freyman et al. | | |
| 2009/0140708 A1 | 6/2009 | Tateishi et al. | | |
| 2011/0241746 A1 | 10/2011 | Fu | | |
| 2011/0304374 A1 | 12/2011 | Krishnan et al. | | |
| 2012/0092051 A1* | 4/2012 | Erdogan | ................ | H03L 7/0812 |
| | | | | 327/158 |
| 2013/0207707 A1 | 8/2013 | Agrawal et al. | | |
| 2014/0037035 A1 | 2/2014 | Chung et al. | | |
| 2014/0247317 A1* | 9/2014 | Kawamura | ............ | H03K 21/02 |
| | | | | 347/248 |
| 2016/0187392 A1 | 6/2016 | Kumar et al. | | |
| 2017/0163271 A1* | 6/2017 | Wu | ................... | G06F 1/0321 |

OTHER PUBLICATIONS

Meidong Lin et al, "Phase Interpolation Technique Based on High-Speed SERDES Chip CDR", 50th International Conference on Computer Sciences and Automation Engineering (ICCSAE 2015), Jan. 2016, pp. 160-165.

Si5341/40 Rev D Data Sheet, Si5341/40 Rev D Data Sheet, Rev 1.0, Silicon Labs, Jul. 15, 2016, pp. 1-53.

George Souliotis et al, "Phase Interpolator with Improved Linearity", Circuits, Systems, and Signal Processing, Feb. 2016, vol. 35, Issue 2, first online May 29, 2015, pp. 367-383.

Understanding Data Converters, Texas Instruments, Inc., Application Report, Mixed-Signal Products, SLAA013, 1995, pp. 1-22.

High Linerarity Phase Interpolator, U.S. Appl. No. 15/346,524, filed Nov. 8, 2016, (29 pages).

* cited by examiner

FRACTIONAL FREQUENCY CLOCK DIVIDER WITH DIRECT DIVISION

BACKGROUND

Many communications and processing devices include circuitry that operates according to different required clock input signals. A viable choice would be a clock tree generating all the required clock frequencies from one single input reference clock. Typically this can be realized by feeding the reference clock to a PLL to create and intermediate high frequency clock signal followed by one or more frequency dividers dividing the high frequency clock to generate lower frequency clock signals for use by the individual circuits. Some frequency divider applications require an integer relationship between the input frequency and the output frequency, where the frequency divider circuit is a counter providing a divider ratio of 1/K, where K is an integer. However, new applications often require one or more output frequencies that do not have an integer relationship to the input clock frequency. Certain fractional divider architectures provide integer fraction output frequencies, such as ⅔, or generally J/K where J and K are small integers to allow for practical intermediate frequencies. Many applications, moreover, require clock tree solutions where several output clocks are generated from one single reference clock, with no restriction on the frequency of the output clock signals. For instance, certain applications involve different data interfaces residing in a single device, each requiring a different clock frequency. In addition, many clock divider applications require output clock signals of high quality with very low level of phase noise, low time domain jitter and control of unwanted spurs, in addition to low power consumption and complexity in terms of occupied area.

SUMMARY

Single and multichannel fraction frequency dividers are presented using direct division to facilitate low time domain integrated jitter and controlled noise, without excessive power consumption or large circuit area. Disclosed examples include fractional frequency divider circuits, including a counter or dynamic divider circuit to provide phase shifted pulse output signals in response to counting of an adjustable integer number $N_K$ cycles of an input clock signal, an output circuit to provide an output clock signal having an edge with digitally adjustable phase/delay with respect to its input reference phase provided by the dynamic frequency divider (counter), as well as a delta-sigma modulator (DSM), clocked by the dynamic divider output signal to receive a first predetermined value and to provide a DSM output value, and a phase accumulator to receive a step input value representing a sum of the DSM output value and a second predetermined value. The phase accumulator provides a divisor input signal to the dynamic divider, and provides a phase adjustment value to the output circuit to control the position of the first edge of the output clock signal between the first edges of the pulse output signals. In one example, the phase adjustment value is used as an index into a lookup table or other code mapper or correction mapper circuit to drive first and second digital to analog converters (DACs) to provide analog output signals to a phase interpolator to control the position of the first edge of the output signal between the first edges of the pulse output signals. In certain examples, the phase interpolator circuit includes a slope adjustment circuit to generate sloped signals according to the edges of the pulse output signals, and the phase interpolator circuit generates the output clock signal edges according to the second sloped signals. The output circuit in certain examples includes divider divide by 2 frequency divider circuit to provide a second output clock signal at a second output frequency to facilitate uniform output clock duty cycle.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 1:
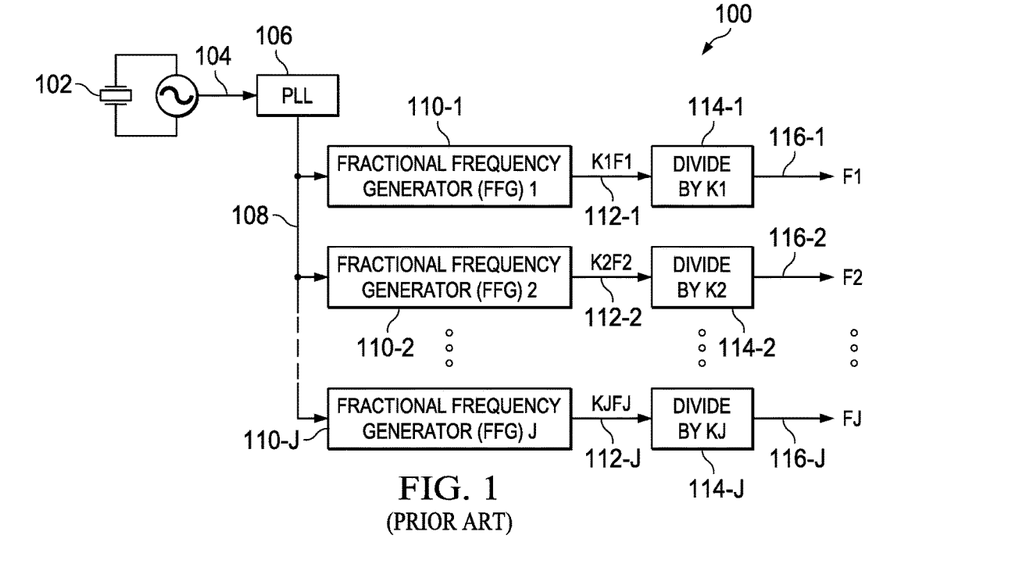
FIG. 1 shows a PLL-based multichannel frequency divider circuit using a single PLL.

FIG. 1 shows a PLL-based multichannel frequency divider circuit 100 with a crystal 102 providing a clock signal to an input 104 of a single high frequency PLL 106 that provides a high frequency input 108 to multiple fractional frequency generators (FFGs) 110-1, 110-2, . . . , 110-J. The FFGs 110 have corresponding outputs 112-1, 112-2 . . . , 112-J respectively providing output signals K1F1, K1F2, . . . , KJFJ with frequencies at or near the input clock frequency but slightly shifted up or down in frequency. Integer divider circuits 114-1, 114-2, . . . , 114-J divide the corresponding FFG output signals K1F1, K1F2, . . . , KJFJ by corresponding integers K-1, K2, . . . , KJ and provide output signals at divider outputs 116-1, 116-2, . . . , 116-J at corresponding frequencies F1, F2, . . . FJ. In this manner, the divider circuit 100 uses integer frequency division to obtain the final output frequencies. The drawback of this approach is that the final divider circuits 114 fold a large portion of the PPG phase noise and its undesired spurs back to the band of frequency offsets that are required to be clean to meet many application specifications. In addition, the FFG circuits 110 and the integer divider circuits 114 in FIG. 1 all operate off the high frequency input clock, and thus are subject to poor power efficiency for high input clock frequencies. Moreover, high-speed circuit components are required for the FFG and the divider circuits 110 and 114.

Figure 2:
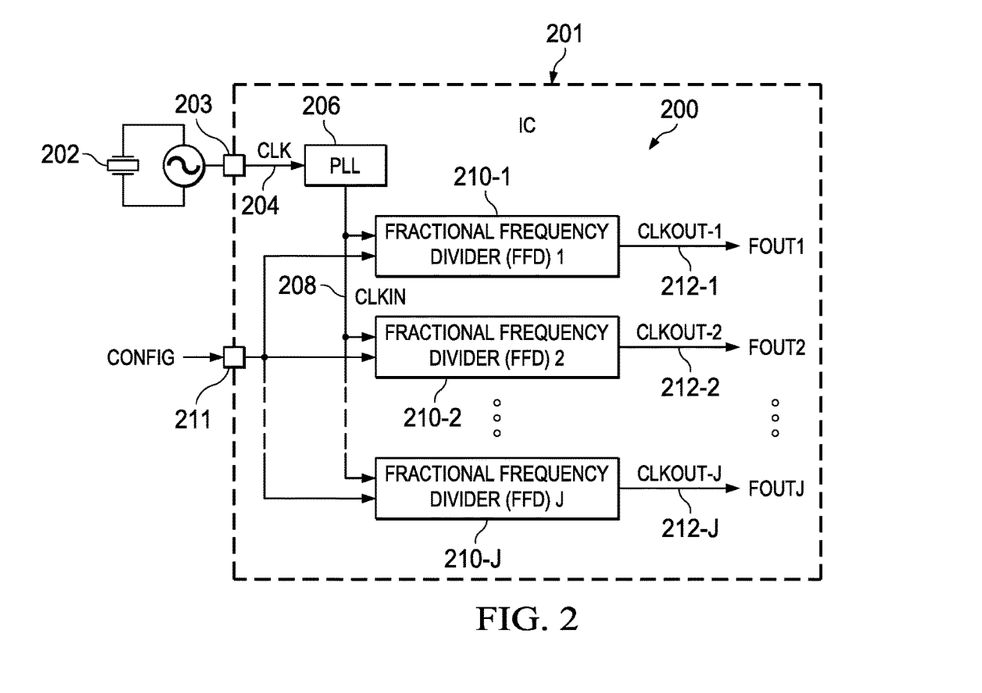
FIG. 2 shows a multichannel fractional frequency divider integrated circuit.

Referring now to FIGS. 2-4, FIG. 2 shows an efficient and simple frequency divider system 200 using a direct fractional frequency divider (DFFD) approach. A high frequency crystal clock source 202, for example 2.5-5.0 GHz, provides a clock signal CLK to an input 204 of a PLL 206. The PLL 206 has an output 208 providing an input clock signal CLKIN to one or more fractional frequency divider (FFD) circuits 210-1, 210-2, . . . , 210-J having outputs 212-1, 212-2, . . . , 212-J. The outputs 212 individually provide a corresponding output signal CLKOUT-1, CLKOUT-2, . . . , CLKOUT-J at corresponding output frequencies FOUT1, FOUT2, . . . , FOUTJ. The circuit 200 advantageously avoids the use of output dividers as was the case in FIG. 1. The divider circuit 200 mitigates or avoids phase noise and spur folding associated with the integer dividers 114 in FIG. 1 by eliminating redundantly generated high quality clock edges by output divider circuitry. The circuit 200 and FIG. 2 also provides fractional frequency generation without requiring complex circuitry as was done in the past. In addition the proposed solution is capable of supporting maximum output frequency compared to the traditional approach of FIG. 1, due to relaxing the speed requirement on a majority of the components within each fractional frequency divider block.

In some examples, the divider circuit 200 is fabricated in an integrated circuit (IC) 201, and may include one or more FFD circuits 210. In one example, the PLL circuit 206 is included in the IC 201, and a terminal (e.g., IC pad or pin) 203 provides connectivity to receive the clock signal CLK from an external circuit (e.g., a crystal as shown, a voltage-controlled oscillator (VCO), or other clock source), and the PLL 206 provides the input clock signal CLKIN to one or more FFD circuits 210. In another example, the PLL 206 is external to the IC 201, and the input pad 203 provides the input clock signal CLKIN to the inputs of the FFD circuit or circuits 210. In certain implementations, output terminals are provided to deliver the output clock signals CLKOUT to external circuitry (not shown).

Figure 3:
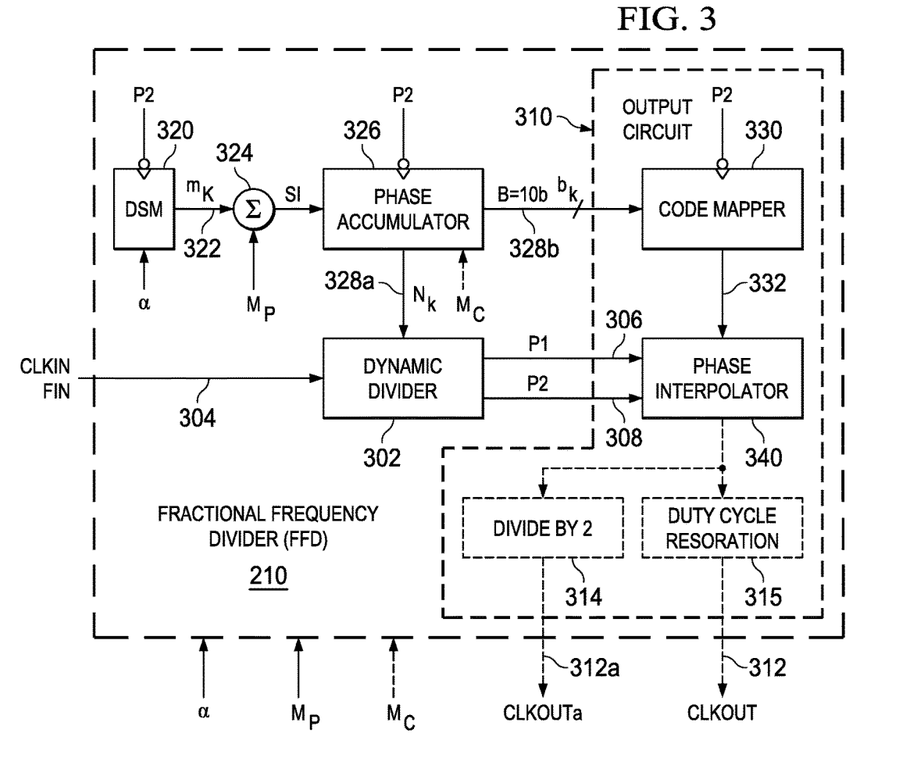
FIG. 3 shows a fractional frequency divider circuit.
Figure 4:
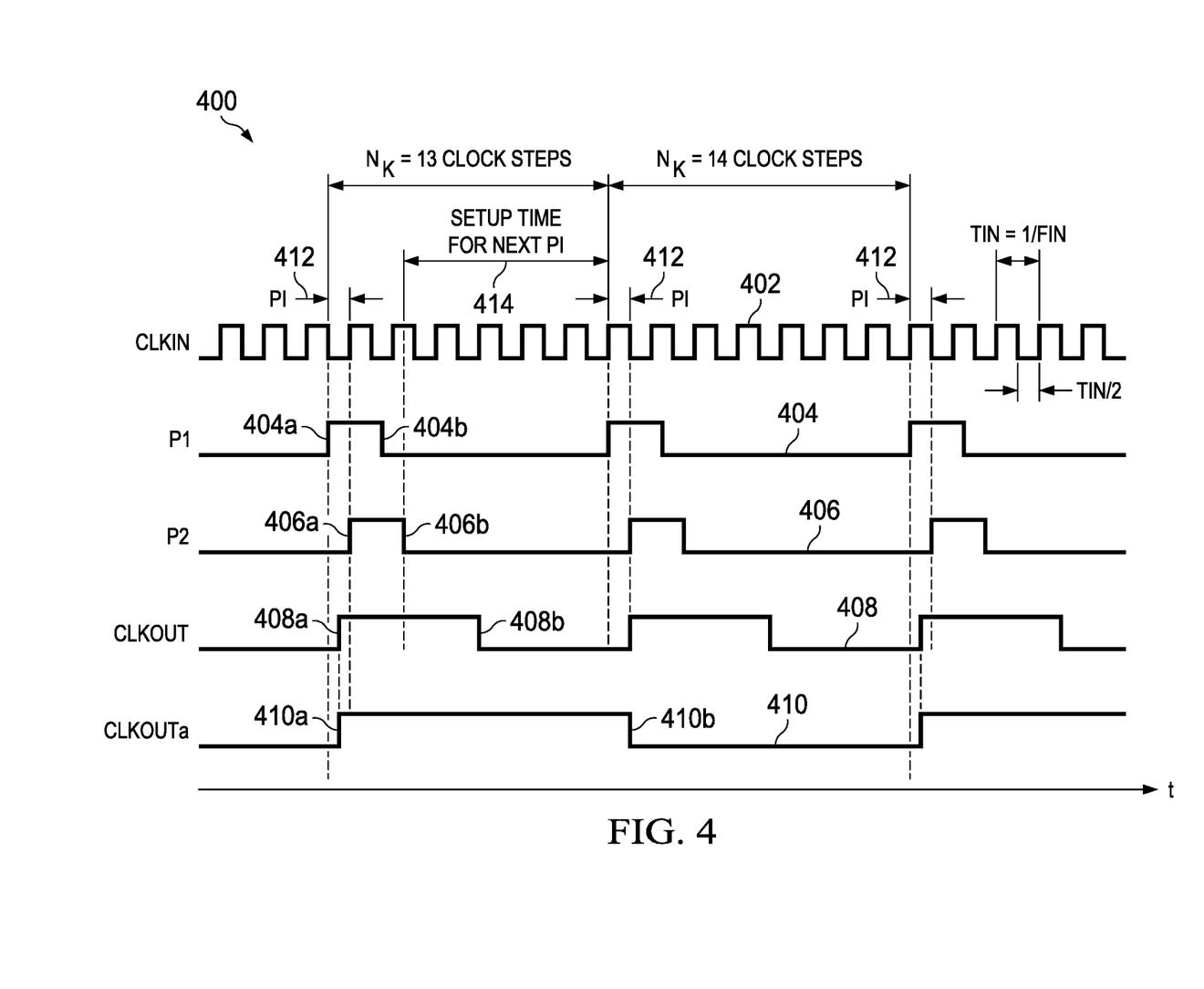
FIG. 4 is a signal diagram showing signal waveforms in the fractional frequency divider circuit of FIG. 3.

FIG. 3 shows further details of an example FFD circuit 210 which includes a dynamic divider circuit 302, an output circuit 310, a delta sigma modulator (DSM) 320, and a phase accumulator circuit 326. FIG. 4 shows a signal diagram 400 including signal waveforms in the PFD circuit 210 of FIG. 3. The dynamic divider 302 provides the dynamic divider circuit 302 includes an input 304 to receive the input clock signal CLKIN having an input frequency FIN. The dynamic divider circuit 302 in one example provides phase shifted first and second the pulse output signals P1 and P2 at outputs 306 and 308, respectively, in response to counting of an adjustable integer number $N_K$ cycles of an input clock signal CLKIN. The dynamic divider circuit 302 includes a first output 306 that provides the first pulse output signal P1. FIG. 4 shows the first pulse output signal P1 at 402, including a first (e.g., rising) edge 404a and a second (e.g., falling) edge 404b. The dynamic divider circuit 302 in one example is a counter circuit that implements a divide by "$N_K$" edge counter function and generates first edge 404a of the signal P1 following or in response to the $N_K$th rising edge of the input clock signal CLKIN. In one example, a second output 308 of the dynamic divider circuit 302 provides the second pulse output signal P2, shown as signal 404 in FIG. 4. The signal P2 includes a first (e.g., rising) edge 406a and a second (e.g., falling) edge 406b. The rising first edge 406a of the signal P2 follows a first rising edge of the $N_K$th falling edge of the input clock signal CLKIN. The dynamic divider circuit 302 also includes a control input to receive a divisor input signal $N_K$ representing the adjustable integer number $N_K$.

The dynamic divider 302 in certain examples acts as an edge counter, which counts only rising edges of the input clock. In other examples, the dynamic divider circuits counts only the falling edges of the input clock. In other examples, the dynamic divider circuit 302 counts all the edges (including rising/falling edges). Any mode of operation of the dynamic divider can be used. The dynamic divider circuit 302 can also include duty cycle control circuitry in order to provide the pulse signals P1 and P2 with a consistent duty cycles. In the illustrated example, the dynamic divider circuit 302 provides the pulse output signals P1 and P2 having pulse widths greater than a full cycle of the input clock signal CLKIN (signal 402 in FIG. 4). In other possible implementations, the dynamic divider circuit 302 provides the first and second pulse output signals P1 and P2 with falling first edges 406a and 406a, along with rising second edges 406b and 406b. In other possible implementations, the dynamic divider circuit 302 provides only the first pulse P1 as input to the phase interpolator 340, and the output circuit 310 uses this input to create its output pulse with a digitally adjustable delay/phase. In such an example, the second pulse P2 can be used as a clock signal as depicted in FIG. 3. In certain implementations, the dynamic divider circuit provides extra timing control signals (not shown) to the output circuit for clocking, setting, and resetting its constituent circuit components.

The output circuit 310 includes a first output 312 that provides a first output clock signal CLKOUT, illustrated as signal 408 in FIG. 4. The first output clock signal CLKOUT has a first output frequency FOUT less than FIN the input frequency, and CLKOUT includes first and second (e.g., rising and falling) edges 408a and 408b. In addition, the CLKOUT signal output circuit 310 provides the first edge 408a of the CLKOUT signal between the first edges 404a and 406a of the pulse output signals P1 and P2. In some examples, the output circuit 310 includes a duty cycle restoration circuit 315 that provides the CLKOUT signal according to the output of the phase interpolator circuit 340. In this example, the rising edge 408a is accurately created by the phase interpolator circuit 340 according to jitter and spur requirements of the targeted applications, while the falling edge 408b can created less accurately by duty cycle restoration block only satisfying the duty cycle requirements of the targeted application. In certain examples, the output circuit 310 avoids using duty cycle restoration 315, and instead incorporates an integer divider circuit 314, such as a divide by 2 circuit in one example to produce output CLKOUTa instead of CLKOUT. The integer divider circuit 314 receives the output from the phase interpolator circuit 340 and includes a second output 312a that provides a second output clock signal CLKOUTa at a second output frequency less than the first output frequency FOUT (e.g., FOUT/2). in other examples different integer dividers 314, for example, divide by 4, divide by 8, etc. is also possible. FIG. 4 illustrates the CLKOUTa signal 410 including a first (e.g., rising) edge 410a and a second (e.g., falling) edge 410b.

The DSM circuit 320 includes a clock input to receive the second pulse output signal P2, and thus operates at a lower frequency than the input frequency FIN. The DSM 320 includes an output 322 that provides a DSM output value $m_K$, and a second input to receive a first predetermined value $\alpha$. The FFD circuit 210 also implements a summation function 324, for example, and adder circuit or programming instructions, to provide a input value SI representing the sum of the DSM output value $m_K$ and the second predetermined value $M_P$. The first predetermined value $\alpha$ can be programmable or configurable in certain implementations. For example, the IC 201 in FIG. 2 includes terminals 211 as one or more configuration input to receive configuration signals or values (illustrated as "CONFIG" in FIG. 2) allowing a user to set or configure the first predetermined value $\alpha$ as well as a second predetermined value $M_P$ and a third predetermined value $M_C$ as discussed further below. These values, in turn, set the fractional divider ratio of the FFD circuit 210.

The phase accumulator 326 includes an input to receive the step input value SI, as well as a first output 328a coupled to the control input of the divider circuit 302 to provide the divisor input signal $N_K$ to set the adjustable integer counter value used to count the edges (rising or fallings edges or both) of the input clock signal CLKIN. In addition, the phase accumulator 326 includes a second output 328b which provides a multibit digital phase adjustment value $b_K$ to the output circuit 310 to control the position of the first edge 408a of the output clock signal CLKOUT between the first edges 404a and 406a of the pulse output signals P1 and P2. In general, the phase accumulator 326 provides an output having B bits, where B=10 in one example.

The output circuit 310 uses the phase adjustment value $b_K$ in order to perform phase interpolation to generate the edges of the first output clock signal CLKOUT at an interpolated temporal location or point between the edges 404a and 406a of the P1 and P2 signals. In this manner, the FFD circuit 210 provides a wide range of possible fractional divisor or divider ratios to provide an output clock at any desired frequency. In the example of FIG. 3, the first output clock signal frequency FOUT=FIN/($M_C$+($M_P$+α)2$^{-B}$) and the second output clock frequency is FOUT/2. As seen in FIG. 3, one example of the output circuit 310 includes a code mapping circuit or correction mapper circuit 330 (labelled "CODE MAPPER" in the drawing), for example, a lookup table (LUT) that provides one or more multi-bit output values 332 (shown as a single value in FIG. 3) according to the phase adjustment value $b_K$, as well as one or more analog to digital converters (DACs, not shown) that provide analog signals to a phase interpolator circuit 340. In practice, the phase interpolator circuit 340 may suffer from nonlinearities. The code mapping circuit 330 and the DAC(s) provide a calibration mechanism to compensate for such phase interpolator nonlinearity. In one example for a 10-bit phase interpolator 326, 13-bit DACs can be used, and an example look up table implementation includes 1024 rows, where each row is a 13-bit code to be used by one of the two DACs. The code mapping circuit 330 can be programmed with suitable values to calibrate the circuit 210 for any nonlinearities of the phase interpolator 340 and/or the DACs. In another example the code mapping may use much small memory size than a direct LUT approach would use. This form of mapping can be done by reading a correction sequence from a smaller memory and modifying the input code by using the correction sequence to create the final output code. The phase interpolator circuit 340 is coupled to the dynamic divider circuit 302 to receive the first and second pulse output signals P1 and P2, and includes an output used to generate the first output clock signal CLKOUT. In operation, the phase interpolator circuit 340 controls the position of the first edge 408a of the output signal CLKOUT between the first edges 404a, 406a of the pulse output signals P1 and P2 according to analog output signals from first and second DACs. In certain examples, the code mapping circuit 330 provides the multibit outputs having a longer bit blanks than the phase adjustment value $b_K$. For example, the code mapping circuit 330 in FIG. 3 provides 13-bit outputs 332 to the DACs based on a 10-bit phase adjustment value $b_K$ from the phase accumulator circuit 326.

In operation, the phase accumulator circuit 326 provides the phase adjustment value $b_K$ to the output circuit 310, which adjusts the location of the output clock edge 408a within a phase interpolation (PI) range 412 between the first edges 404a and 406a of the P1 and P2 signals. In the example of FIG. 4, the divisor input signal $N_K$ initially has a value of 13 clock steps, where the clock step is a half cycle of the input clock CLKIN 402, with the corresponding first edge 408a of the output clock signal CLKOUT 408 initially around 30% between the first edges 404a and 404b. In the next output clock cycle, the phase accumulator 326 adjusts the phase adjustment value $b_K$ to cause the phase interpolator 342 locate the rising output clock edge closer to the first edge 406a of the second pulse output signal P2. In this example, moreover, the phase accumulator 326 provides the output to set the integer divisor signal $N_K$ to represent 14 clock steps for the subsequent output clock cycle. In the next output clock cycle in FIG. 4, the phase accumulator circuit 326 provides an updated phase adjustment value $b_K$ to relocate the rising edge of the CLKOUT signal 408 closer to the first edge 404a of the P1 pulse output signal 404.

Figure 5:
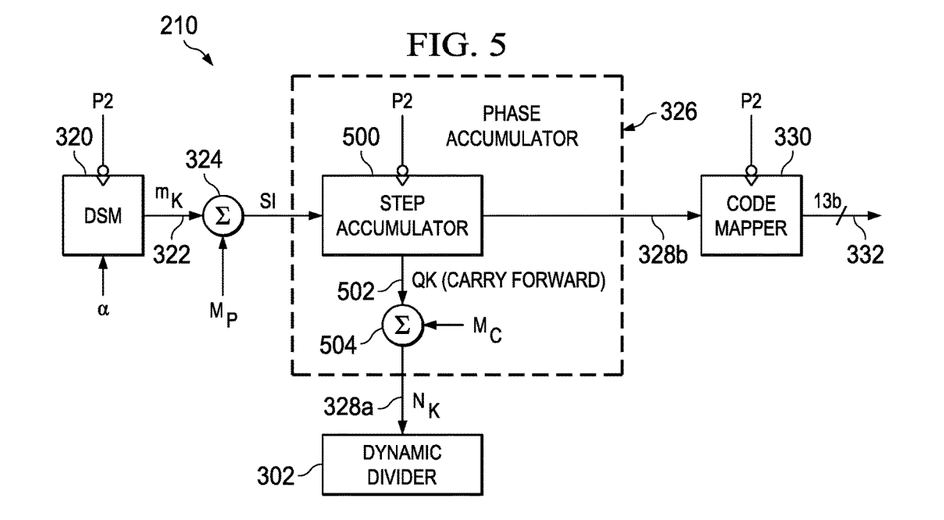
FIG. 5 shows further details of an example phase accumulator in the fractional frequency divider circuit of FIG. 3.

Referring also to FIG. 5, the phase accumulator circuit 326 in one example is implemented using a step accumulator circuit 500. The step accumulator circuit 500 includes a clock input to receive the second pulse output signal P2, as well as an input to receive the step input value SI. The step accumulator circuit 500 also includes a first step accumulator output 502 to provide a carry forward value QK, and a second step accumulator output 328b provides the phase adjustment value $b_K$ to the output circuit 310 to control the temporal position of the first edge 408a of the first clock output signal CLKOUT between the edges 404a and 404b of the P1 and P2 signals. A summation or addition circuit or function 504 adds the carry forward value QK from the first step accumulator output 502 with a third predetermined value $M_C$. The first output 328b of the phase accumulator circuit 326 in this example provides the divisor input signal $N_K$ to the control input of the dynamic divider circuit 302 according to the sum of the values QK and $M_C$.

As seen in FIGS. 3 and 5, the output circuitry 310 as well as the DSM 320, the phase accumulator 326 and the code mapping circuit 330 are clocked by the P2 signal, and thus operate at a low frequency compared with the input frequency FIN of the input clock signal CLKIN. In some implementations, the dynamic divider circuit 302 may provide another timing signal to be used as clock instead of pulse P2. This timing signal needs to have the same rate as pulses P1 and P2, but a different delay or pulse duration. This design therefore provides advantages compared to conventional approaches, since high-speed digital circuit components are not required for the component circuits 310, 320 and 326 of the FFD circuit 210, and these circuits consume less power than circuitry operating off of the input clock CLKIN. The example FFD circuit 210 in FIG. 3 uses both falling and rising edges of the input clock signal CLKIN to generate edges of the output clock signal CLKOUT. In this case, the dynamic divider circuit 302 performs an edge counting on input CLKIN. In the illustrated example depicted in FIG. 4 the dynamic divider circuit 302 provides a first pulse output signal P1 with a rising edge corresponding to a falling edge of the input clock signal CLKIN as well as a second pulse output signal P2 with a rising edge corresponding to a subsequent rising edge of the input clock signal CLKIN. In this example, the first and second pulse output signals P1 and P2 provide pulses having a duration longer than the clock cycle of the input signal CLKIN. As further shown in FIG. 4, moreover, the FFD circuit 210 provides a set up time 414 to allow adjustment of the outputs of the phase interpolator circuit 340 (for example settling the DACs utilized within this circuit) beginning with the second or falling edge 406b of the second pulse output signal P2 before the next first or rising edge of the P1 pulse output signal. The circuit 210 operates based on a clock step equal to one half of the period TIN of the input clock signal CLKIN (TIN=1/FIN) for a clock step of TIN/2, and the output clock signal CLKOUT has a period TOUT of 1/FOUT, with FOUT=2FIN/($M_C$+($M_P$+α)$2^{-B}$) as shown in FIG. 4.

The output signals P1 and P2 are provided from the first and second dynamic divider circuit outputs 306 and 308, respectively, as inputs to the phase interpolator circuit 340. The phase interpolator circuit 340 provides phase interpolation to generate rising edges of the output clock signal CLKOUT provided at the output 312 in between rising edges of the P1 and P2 pulse output signals. The dynamic divider circuit 302 operates according to an adjustable comp value $N_K$ received from a first output 328a of the phase accumulator circuit 326. In operation, the phase interpolator circuit 340 adjusts the edge location between the respective rising edges of P1 and P2 according to the code mapper output 332. The phase interpolator operates according to a value from the code mapping circuit 330 that operates according to (e.g., clocked by) the falling edges of P2. The time between consecutive pulses in the P1 signal, as well as the time between consecutive pulses in the P2 signal, is controlled according to an adjustable integer divisor value $N_K$ provided by the phase accumulator circuit 326.

The combination of the phase interpolation via the circuit 340 to generate the output clock edges, as well as the adjustment of the divider circuit divisor value $N_K$ provides fractional frequency division by the FFD circuit 210 without requiring additional multipliers and dividers and/or extra PLL circuitry associated with conventional fractional frequency divider approaches. The dynamic divider circuit 302 in one example includes high-speed digital circuitry to provide clean edges to the pulse output signals P1 and P2. The remainder of the circuitry in the FFD 210 does not need to include high-speed digital circuit components, as these are operated at the lower (e.g., divided) output frequency FOUT, e.g., clocked by P2 in the example of FIG. 3. Moreover, operation of the remaining FFD components at the lower output frequency FOUT facilitates low power operation of the FFD circuit 210. The parameters α, $M_P$ and $M_C$ define the effective fractional divide ratio of the FFD circuit 210, and can be user-defined such as by programming an IC implementation of a single FFD circuit 210 or a multi-channel divider system 201 as shown in FIG. 2, with the IC 201 including suitable pins or pads allowing configuration or programming of the parameters α, $M_P$ and $M_C$. In the illustrated implementation, $M_C$ is an integer value defining large or big steps for advancing the value $N_K$, and the parameter $M_P$ is an integer defining small steps for adjusting the input to the step accumulator circuit 500 in FIG. 5. The parameter α in one example is a programmable value representing a real value between 0 and 1. In practice the parameter α is represented by fixed point. The fixed point accuracy in representing this parameter will define the final output frequency resolution in terms of ppm (parts per million) or ppb (parts per billion) and so on. In practice, the fractional divide ratio of the FFD circuit 210 is set by configuration of the parameters α, $M_P$ and $M_C$ through user input, or these values can be preset in certain examples.

The phase interpolator 340 generates the output clock signal CLKOUT according to the P1 and P2 pulse output signals. In one example, the phase interpolator circuit 340 can be a quadrature phase interpolator. Two DAC circuits are deployed inside the phase interpolator circuit 340, with the first and second DAC circuits receive multibit outputs for the respective signals P1 and P2 and individually provide analog output signals to the phase interpolator circuit 340 to control the position of the first edges 410a of the output signal CLKOUT between the first edges 404a and 406a of the pulse output signals P1 and P2. In practice, the phase interpolator circuit 340 and its constituent DACs may add some level of nonlinearity, and the code mapping circuit 330 has first and second 13-bit outputs that provide 13-bit output values to the respective DACs to facilitate calibration of such phase interpolator nonlinearity. In one example, the DACs provide a current signal to circuitry within the phase interpolator in order to provide a calibrated amount of offset current according to the corresponding code mapping circuit value to accommodate phase nonlinearity of the phase interpolator circuit 340. The DAC codes provided by the code mapping circuit 330 control the analog signals provided to the phase interpolator circuit 340 to adjust the position of the output clock edge between the corresponding edges of the P1 and P2 signals. The code mapping circuit 330 in one example receives a 10-bit input value bx from the second output 328b of the phase accumulator circuit 326. In general, the phase accumulator 326 provides a digital output signal $b_K$ of length "B", where B=10 bits in the illustrated example. The code mapping circuit 330 provides the DAC code outputs at a higher bit resolution e.g., 13 bits). This allows finer control of the time-domain distance between the output clock edge and the edges of the corresponding P1 and P2 signals. After the falling edge of the corresponding P2 pulse signal, the circuit 210 as a set up time 414 FIG. 4) to allow the updated code mapping circuit value to change operation of the DACs for a subsequent phase interpolation.

The input clock signal CLKIN defines a time grid with a granularity of half a clock cycle (TIN/2) that defines a clock step for operation of the circuit 210. For input clocks that have some level of duty cycle distortion, the full clock cycle (TIN) can alternatively in other implementations used as a clock step. The edge counter circuit 302 effectively counts a given number $N_K$ clock edges or clock steps, and outputs a duty cycled pulse P1 having a rising edge $N_K$ clock steps from its previous rising edge. As previously noted, the parameter $N_K$ is not fixed and can be updated by the phase accumulator circuit 326. The second output pulse signal P2 is phase shifted from P1 by one clock step. The ideal edges of the final output clock will be somewhere between the two rising edges of P1 and P2 in order to accommodate potentially complex fractional divisor ratios for the FFD circuit 210.

The phase interpolator 340 in one example is a linear phase interpolator controlled by the two DACs that establish a high resolution time grid between the two rising edges 404a and 406a of P1 and P2. The time grid of the 13-bit DACs have a granularity (e.g., a phase interpolator step or PI step) of the clock step divided by $2^B$, where B is the effective resolution of the phase interpolator (e.g., B=10 in the above example). The output clock edges are generated by the phase interpolator 340 using the edge counter 302 and the phase interpolation the output clock edges 408a are generated with the resolution of the PI step. For example, a 5 GHz input clock with reliable 50% duty cycle will establish 100 ps clock step that, combined with 10-bit (B=10) PI step, provides a final temporal adjustment granularity of less than 100 fs. Because the FFD circuit 210 can be used for potentially any divisor ratio and input clock frequency FIN, ideally there is no restriction on the output frequency FOUT. In practice, the desired output clock will not necessarily stay on this high resolution time grid, and some level of quantization noise may be present on the produced output edges 408a and 408b of the output clock signal CLKOUT.

The DSM 320 facilitates achieving the desired output frequency FOUT and also helps push a large portion of the quantization noise power out of the desired frequency offset band (e.g., 10 KHz to 10 MHz). In operation the DSM 320 performs dithering at the level of PI steps and provides proper level of noise shaping according to its adopted order and architecture and provides a dithering sequence with time average equal to the predetermined value α. The phase accumulator circuit 326 controls the dynamic divider parameter $N_K$, and also generates the proper phase adjustment values for the phase interpolator 340 through the phase adjustment value bx and the code mapping circuit 330. In operation, the phase accumulator circuit 326 moves $M_C$ clock steps and $M_P+m_K$ PI steps forward, where $m_K$ is the delta-sigma modulator output at the Kth edge. Over time, the average value of the $m_K$ sequence converges to the input value of α. In one implementation, α is a multibit value between 0 and 1 representing a residual fractional portion of the PI step, and $M_P$ and $M_C$ are small and large step sizes for the clock and PI steps, respectively. The phase accumulator clock step in the illustrated example is TIN/2, and the PI step is the clock step/$2^B$. In each output clock cycle TOUT, the circuit 326 advances $M_P+m_K$ phase steps and $M_C$ clock steps forward. The current content of the accumulator is incremented by the step input SI=$M_P+m_K$. The phase adjustment value $b_K$=MOD ($b_{K-1}+M_P+m_K$, $2^B$), where $b_{K-1}$ is the value of $b_K$ from the previous cycle. In this example, the carry forward value $Q_K=\lfloor(b_{K-1}+M_P+m_K)/2^B\rfloor$. The circuit 210 moves forward $N_K=M_C+Q_K$ clock steps that for the Kth output edge. The phase interpolator circuit 340 in one example provides accurate generation of rising edges. As discussed previously, the integer divider circuit 314 can be used to ensure small or no duty cycle distortion on the generated output frequency FOUT/2. In other examples, the first output clock signal CLKOUT is provided to the recipient circuit, and the output circuit 310 can include suitable circuitry to ensure that the falling edges are within a prescribed acceptable duty cycle range.

The phase interpolator circuit 340 in one example includes a slope adjustment circuit (not shown) to generate a first sloped signal according to the edge 404a of the first pulse output signal P1, and a second sloped signal according to the edge 406a of the second pulse output signal P2. In this example, the phase interpolator circuit 340 generates the first edge 408a of the first output clock signal CLKOUT according to the sloped signals. The phase interpolator 340 may include conventional phase interpolator circuits that operate with sine waves or 50% duty-cycled waveforms. In such an approach, the phase interpolator circuit 340 directly uses the multiple phases of the input clock (for example quadrant signals) and the dynamic divider circuit 302 provides an edge selection pulse with similar shape to the pulse signal P1. The edge selection signal is applied to the interpolated waveform through an AND gate (not shown) to let the desired edges of the waveform to go through. In other examples, absent this condition, a slope adjustment circuit can be used to facilitate phase interpolation for non 50% duty cycled waveforms P1 and P2. In one example, such a slope adjustment circuit can include RC circuits or other suitable circuitry to generate the sloped signals with enough level of slope at the edges of P1 and P2 to facilitate proper phase interpolation in the circuit 340. Amplitude interpolation of the sloped signals provides a phase/time interpolation functionality. The edges in one example are created by a switching transistor circuit charging a capacitor using a fixed current source (not shown). During the on time of the pulses P1 and P2, the corresponding slope adjustment circuits are charged, and during the P1 and P2 off time, the slope adjustment circuits are discharged to provide the sloped signals. Another example only uses the P1 pulse as input to the phase interpolator circuit 340 and the starting level of the sloped signal is adjusted using a voltage DAC (not shown). Using this approach, the DAC value is controlled by the output of the code mapping circuit 330, and different DAC levels result in different level crossing times of the generated sloped signal. In such an approach, the phase interpolator circuit 340 is performing as a digital-to-phase convertor as it is only using one input and thus no interpolation is actually performed. For large enough RC time constant values of the charging circuit, such a slope circuit creates a desired linear slope. The bandwidth of the phase interpolator circuit 340 and its constituent components is designed to be large enough to ensure output settling between the falling edge 406b of the signal P2 to the next rising edge of P1. The resulting P1 and P2 duty cycle relaxes the speed requirement of the phase interpolator circuit 340.

As previously mentioned, the disclosed examples provide ICs 201, divider systems 200 and FFD circuits 210 that use direct fractional frequency division and avoid using output dividers. This, in turn, facilitates low power compact designs that are robust and provide a wide range of divisor values by use of the edge counter 302 applied to the high speed input clock before any processing. In contrast to frequency dividers with fixed count modules, the edge counter parameter $N_K$ in the circuits 210 is not fixed and can change from one output edge to the next. Moreover, quadrature interpolation is not required, and rather than creating several phases (e.g., 4 to 8) for phase interpolation as in some conventional approaches, only two phases P1 and P2 are generated and used for phase interpolation in the circuits 210. Two-phase duty-cycled operation avoids the requirement for phase Multiplexing or switching used in other multi-phase approaches. Accordingly, overall operation is largely glitch free and this has two-fold effect in complexity reduction as there is no need for phase mux/switching and the operation is glitch free and does not require glitch removal circuitry.

Moreover, low power consumption is achieved and, apart from the edge counter 302, the rest of the constituent circuits 310, 320 and 326 do not need to work with the high speed input clock (instead these are clocked by P2 which is at the rate 1× or 2× of the output clock frequency in some examples shown above). In addition, the use of duty-cycled pulse output signals P1 and P2 can provide large enough transition time to relax speed requirements of the constituent DAC components employed within the phase interpolator circuit 340. Furthermore, removal of output integer dividers as utilized in FIG. 1 but removed in FIG. 2 avoids the associated phase noise and spur folding effects. The disclosed examples can therefore fully benefit from noise shaping capability of the delta-sigma modulator 320 without any restriction on its order except its complexity. In operation, the disclosed examples provide a low power, low-complexity solution while achieving at the same time high performance in terms of phase noise and spur level for fully fractional clock division to facilitate high accuracy with resolution on the order of 0.01 parts per billion (PPB) and less compared to the input clock, as well as integrated time domain jitter of less than 130 fs RMS over a band of 10 KHz to 20 MHz, and spur level of −100 dBC relative to the main clock carrier power.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A fractional frequency divider (FFD) circuit, comprising:
  a dynamic divider circuit to count clock edges of an input clock signal having an input frequency and to provide phase shifted first and second pulse output signals in response to counting of an adjustable integer number $N_K$ cycles of the input clock signal, the dynamic divider circuit including:
    a first output to provide the first pulse output signal including a first edge and a second edge, the first edge of the first pulse output signal following an Nth edge in a sequence of $N_K$ consecutive edges of the input clock signal,
    a second output to provide the second pulse output signal including a first edge and a second edge, the first edge of the second pulse output signal following a first edge of the Nth edge of the input clock signal, and
    a control input to receive a divisor input signal representing the adjustable integer number $N_K$;
  an output circuit including a first clock output to provide a first output clock signal at a first output frequency having first and second edges, the output circuit providing the first edge of the first output clock signal between the first edge of the first pulse output signal and the first edge of the second pulse output signal;
  a delta-sigma modulator (DSM), including a clock input to receive the second pulse output signal, a second input to receive a first predetermined value, and an output to provide a DSM output value; and
  a phase accumulator circuit, including an input to receive a step input value representing a sum of the DSM output value and a second predetermined value, a first output coupled to provide the divisor input signal to the control input of the dynamic divider circuit, and a second output to provide a phase adjustment value to the output circuit to cause the output circuit to control a position of the first edge of the first output clock signal between the first edges of the first and second pulse output signals.

2. The FFD circuit of claim 1, wherein the output circuit comprises:
  a code mapping circuit to provide first and second multi-bit output values according to the phase adjustment value;
  a phase interpolator circuit coupled to the dynamic divider circuit to receive the first and second pulse output signals, the phase interpolator circuit including an output to provide the first output clock signal, the phase interpolator circuit operative to control the position of the first edge of the first output clock signal between the first edges of the first and second pulse output signals according to a digital code provided by the code mapping circuit.

3. The FFD circuit of claim 2, wherein the phase interpolator circuit has a fixed delay, and wherein a rising edge of the first output clock signal is adjustable and is not located between rising edges of the first and second pulse output signals.

4. The FFD circuit of claim 2, wherein the phase interpolator circuit operates as a digital-to-time convertor according to only the first pulse output signal to generate the rising edge of the first output clock signal with an adjustable time delay according to the digital code from the code mapping circuit.

5. The FFD circuit of claim 2, wherein the output circuit includes an integer divider circuit to receive an output signal from the phase interpolator circuit, the integer divider circuit including a second output to provide a second output clock signal at a second output frequency less than the first output frequency.

6. The FFD circuit of claim 2,
  wherein the phase accumulator circuit includes a step accumulator circuit, the step accumulator circuit including:
    a clock input to receive the second pulse output signal,
    an input to receive the step input value,
    a first step accumulator output to provide a carry forward value, and
    a second step accumulator output to provide the phase adjustment value to the output circuit; and
  wherein the first output of the phase accumulator circuit provides the divisor input signal to the control input of the dynamic divider circuit according to a sum of the carry forward value from the first step accumulator output and a third predetermined value.

7. The FFD circuit of claim 6, wherein the first predetermined value, the second predetermined value, and the third predetermined value are configurable.

8. The FFD circuit of claim 1, wherein the dynamic divider circuit operates as an edge counter to count only rising edges of the input clock signal, or to count only falling edges of the input clock signal, or to count all the rising and falling edges of the input clock signal.

9. The FFD circuit of claim 1, wherein the first predetermined value and the second predetermined value are configurable.

10. The FFD circuit of claim 1, wherein the first edge of the first pulse output signal is a rising edge and the second edge of the first pulse output signal is a falling edge, and wherein the first edge of the second pulse output signal is a rising edge and the second edge of the second pulse output signal is a falling edge.

11. A frequency divider system, comprising:
  a phase locked loop circuit with an output to provide an input clock signal;
  a plurality of fractional frequency divider (FFD) circuits, the individual FFD circuits including:
    a dynamic divider circuit to count clock edges of the input clock signal having an input frequency and to provide phase shifted first and second pulse output signals in response to counting of an adjustable integer number $N_K$ cycles of the input clock signal, the dynamic divider circuit including:
      a first output to provide the first pulse output signal including a first edge and a second edge, the first edge of the first pulse output signal following an Nth edge in a sequence of $N_K$ consecutive edges of the input clock signal,
      a second output to provide the second pulse output signal including a first edge and a second edge, the first edge of the second pulse output signal following a first edge of the Nth edge of the input clock signal, and
a control input to receive a divisor input signal representing the adjustable integer number $N_K$,
an output circuit including a first clock output to provide a first output clock signal at a first output frequency having first and second edges, the output circuit providing the first edge of the first output clock signal between the first edge of the first pulse output signal and the first edge of the second pulse output signal,
a delta-sigma modulator (DSM), including a clock input to receive the second pulse output signal, a second input to receive a first predetermined value, and an output to provide a DSM output value, and
a phase accumulator circuit, including an input to receive a step input value representing a sum of the DSM output value and a second predetermined value, a first output coupled to provide the divisor input signal to the control input of the dynamic divider circuit, and a second output to provide a phase adjustment value to the output circuit to cause the output circuit to control a position of the first edge of the first output clock signal between the first edges of the first and second pulse output signals.

12. The frequency divider system of claim 11, wherein the output circuit comprises:
a code mapping circuit to provide first and second multi-bit output values according to the phase adjustment value; and
a phase interpolator circuit coupled to the dynamic divider circuit to receive the first and second pulse output signals, the phase interpolator circuit including an output to provide the first output clock signal, the phase interpolator circuit operative to control the position of the first edge of the first output clock signal between the first edges of the first and second pulse output signals according to the digital code provided by the code mapping circuit.

13. The frequency divider system of claim 12, wherein the phase interpolator circuit has a fixed delay, and wherein a rising edge of the first output clock signal is adjustable and is not located between rising edges of the first and second pulse output signals.

14. The frequency divider system of claim 12, wherein the phase interpolator circuit operates as a digital-to-time convertor according to only the first pulse output signal to generate a rising edge of the first output clock signal with an adjustable time delay according to the digital code from the code mapping circuit.

15. The frequency divider system of claim 12, wherein the output circuit includes an integer divider circuit to receive an output signal from the phase interpolator circuit, the integer divider circuit including a second output to provide a second output clock signal at a second output frequency less than the first output frequency.

16. The frequency divider system of claim 12,
wherein the phase accumulator circuit includes a step accumulator circuit, the step accumulator circuit including:
a clock input to receive the second pulse output signal,
an input to receive the step input value,
a first step accumulator output to provide a carry forward value, and
a second step accumulator output to provide the phase adjustment value to the output circuit; and
wherein the first output of the phase accumulator circuit provides the divisor input signal to the control input of the dynamic divider circuit according to a sum of the carry forward value from the first step accumulator output and a third predetermined value.

17. The frequency divider system of claim 16, wherein the first predetermined value, the second predetermined value, and the third predetermined value are configurable.

18. The frequency divider system of claim 11, wherein the first predetermined value and the second predetermined value are configurable.

19. The frequency divider system of claim 11, wherein the PLL circuit and the plurality of FFD circuits are fabricated in a single integrated circuit.

20. An integrated circuit (IC), comprising:
a fractional frequency divider (FFD) circuit, including:
a dynamic divider circuit to count clock edges of an input clock signal having an input frequency and to provide phase shifted first and second pulse output signals in response to counting of an adjustable integer number $N_K$ cycles of the input clock signal, the dynamic divider circuit including:
a first output to provide the first pulse output signal including a first edge and a second edge, the first edge of the first pulse output signal following an Nth edge in a sequence of $N_K$ consecutive edges of the input clock signal,
a second output to provide the second pulse output signal including a first edge and a second edge, the first edge of the second pulse output signal following a rising edge of the Nth edge of the input clock signal, and
a control input to receive a divisor input signal representing the adjustable integer number $N_K$,
an output circuit including a first clock output to provide a first output clock signal at a first output frequency having first and second edges, the output circuit providing the first edge of the first output clock signal between the first edge of the first pulse output signal and the first edge of the second pulse output signal,
a delta-sigma modulator (DSM), including a clock input to receive the second pulse output signal, a second input to receive a first predetermined value, and an output to provide a DSM output value, and
a phase accumulator circuit, including an input to receive a step input value representing a sum of the DSM output value and a second predetermined value, a first output coupled to provide the divisor input signal to the control input of the dynamic divider circuit, and a second output to provide a phase adjustment value to the output circuit to cause the output circuit to control a position of the first edge of the first output clock signal between the first edges of the first and second pulse output signals.

21. The IC of claim 20, comprising a plurality of FFD circuits individually coupled to receive the input clock signal and to provide a corresponding output clock signal, the individual FFD circuits including a dynamic divider circuit, an output circuit, a DSM, and a phase accumulator circuit as set forth in claim 20.

22. The IC of claim 21, further comprising:
an input terminal to receive a clock signal; and
a phase locked loop circuit coupled to receive the clock signal from the input terminal, the PLL circuit providing the input clock signal to the dynamic divider circuits of the individual FFD circuits.

23. The IC of claim 20, further comprising:
an input terminal to receive a clock signal; and
a phase locked loop circuit coupled to receive the clock signal from the input terminal, the PLL circuit providing the input clock signal to the dynamic divider circuit of the FFD circuit.

24. The IC of claim 20, wherein the output circuit comprises:
a code mapping circuit to provide first and second multi-bit output values according to the phase adjustment value;
a first digital to analog converter (DAC) to provide a first analog output signal according to the first multi-bit output value from the code mapping circuit;
a second DAC to provide a second analog output signal according to the second multi-bit output value from the code mapping circuit; and
a phase interpolator circuit coupled to the dynamic divider circuit to receive the first and second pulse output signals, the phase interpolator circuit including an output to provide the first output clock signal, the phase interpolator circuit operative to control the position of the first edge of the first output clock signal between the first edges of the first and second pulse output signals according to the digital code provided by the code mapping circuit.

25. The IC of claim 24, wherein the phase interpolator circuit has a fixed delay, and wherein a rising edge of the first output clock signal is adjustable and is not located between rising edges of the first and second pulse output signals.

26. The IC of claim 24, wherein the phase interpolator circuit operates as a digital-to-time convertor according to only the first pulse output signal to generate a rising edge of the first output clock signal with an adjustable time delay according to the digital code from the code mapping circuit.

27. The IC of claim 24, wherein the output circuit includes an integer divider circuit to receive an output signal from the phase interpolator circuit, the integer divider circuit including a second output to provide a second output clock signal at a second output frequency less than the first output frequency.

* * * * *